(12) United States Patent
Di Veroli et al.

(10) Patent No.: US 6,549,051 B1
(45) Date of Patent: Apr. 15, 2003

(54) SYNCHRONOUS DELAY GENERATOR

(75) Inventors: Maurizio Di Veroli, Haifa (IL); Ayal Bar-David, Haifa (IL)

(73) Assignee: Qualcomm, Inc., San Diego, CA (US)

( * ) Notice: Subject to any disclaimer, the term of this patent is extended or adjusted under 35 U.S.C. 154(b) by 0 days.

(21) Appl. No.: 09/531,982

(22) Filed: Mar. 20, 2000

(51) Int. Cl.$^7$ ............................................... H03H 11/26
(52) U.S. Cl. ...................... 327/270; 327/158; 327/161; 327/285
(58) Field of Search ................................ 327/158, 161, 327/269–272, 276–278, 284, 285

(56) References Cited

U.S. PATENT DOCUMENTS

| | | | |
|---|---|---|---|
| 3,997,772 A | | 12/1976 | Chrochiere et al. |
| 4,907,247 A | | 3/1990 | Miyake et al. |
| 5,055,708 A | * | 10/1991 | Sugawara .................... 327/110 |
| 5,304,854 A | * | 4/1994 | Aoki et al. .................. 327/164 |
| 6,147,531 A | * | 11/2000 | McCall et al. ............... 327/147 |

FOREIGN PATENT DOCUMENTS

| | | |
|---|---|---|
| EP | 0639347 A | 2/1995 |
| JP | 04288747 | 10/1992 |

OTHER PUBLICATIONS

Patent Abstracts of Japan vol. 017, No. 097 (E.–1326), Feb. 25, 1993 & JP 04 288747 A (Sony Corp.), Oct. 13, 1992 abstract.

XP 000106903, Liu G–S et al., "Programmable Fractional Sample Delay Filter With Lagrange Interpolation"; Electronics Letters, GB IEEE Stevenage, vol. 26, No. 19, Sep. 13, 1990, pp. 1608–1610, ISSN:0013–5194.

XP000474909, Murphy, N.P. et al., "Implementation of Wideband Interger And Fractional Delay Element", Electronics Letters, GB, IEE Stevenage, vol. 30, No. 20, Sep. 29, 1994, pp. 1658–1659, ISSN: 0013–5194.

\* cited by examiner

*Primary Examiner*—Kenneth B. Wells
(74) *Attorney, Agent, or Firm*—Philip R. Wadsworth; Gregory D. Ogrod

(57) ABSTRACT

A method for generating a variable delay of a signal, including: providing a clock indicating a sequence of sample times at regular intervals and receiving a sequence of input samples representing input values of the signal at respective sample times indicated by the clock. The method further includes determining the delay with a temporal resolution substantially finer than the clock interval to be applied to the signal at each of the respective sample times. For each of the sample times, responsive to the respectively-determined delay, one or more of the input samples are processed so as to generate a corresponding output sample representing a delayed output value of the signal at the sample time.

16 Claims, 9 Drawing Sheets

SYNCHRONOUS DELAY GENERATOR

BACKGROUND OF THE INVENTION

I. Field of the Invention

The present invention relates generally to signal processing systems, and specifically to devices for generating signal delays of controlled, variable duration.

II. Related Art

The sophistication of communication systems is rapidly increasing. For example, a communication system may include an array of satellites which serve as relay stations. In developing an apparatus which uses the array of satellites, it is desirable to test the apparatus during development without placing the satellites in orbit. In such a case it is desirable to have a simulator which simulates the operation of the array of satellites. A major component of such a simulator is a delay generator which accurately delays signals for calculated periods. Due to simulated motion of the satellites, the delay varies dynamically over time.

A standard delay generator receives as input samples of an input signal and provides the samples as an output after their respective delays. Since the delay may be different for each sample, the output samples are not synchronized with each other or with the input. The lack of synchronization imposes constraints on apparatus receiving the output samples for further processing, for example, on a digital-to-analog converter or other circuits operating on a fixed, synchronous clock.

U.S. Pat. No. 4,907,247, to Miyake et al., which is incorporated herein by reference, describes a satellite simulation system in which multiple digital satellite communication terminals are interconnectable over multiple channels. The equipment includes a single satellite delay simulator intervening between transmit communication terminals and receive communication terminals. The delay simulator is implemented by a satellite delay circuit accommodating multiple channels and clock matching circuits. The communication terminals are individually connectable to the delay circuit via the clock matching circuits.

SUMMARY OF THE INVENTION

It is an object of some aspects of the present invention to provide a delay generator which provides a synchronized output.

It is another object of some aspects of the present invention to provide methods and apparatus for delaying signals for a predetermined period and providing the delayed signals synchronously.

It is still another object of some aspects of the present invention to provide a delay generator whose output is synchronized with its input.

In preferred embodiments of the present invention, a delay generator receives samples of an input signal which have been sampled at a constant clock rate and calculates for each sample the required time it is to be delayed. Rather than delaying each sample by the required delay time, however, the samples are actually delayed so as to remain in synchronization with the clock rate. The values of the delayed samples are corrected to compensate for the difference between the actual delay time and the required delay time, which difference is evaluated to a resolution substantially greater than the clock rate, typically by orders of magnitude. Adjusting the delayed samples to be in synchronization with the input samples, and using the difference to evaluate the delayed sample, significantly simplifies construction and operation of other processing circuitry associated with the delay generator.

In some preferred embodiments of the present invention, the required time by which each sample is to be delayed is calculated by integration. At the beginning of a simulation session an actual delay, and a first differential of the actual delay, are calculated and are loaded into respective registers of an integrator. Preferably, new precalculated values of the differential are loaded into its register at predetermined times during the simulation. During the simulation, the integrator iteratively calculates new values of the actual delay, and updates the appropriate register.

In some preferred embodiments of the present invention, the delay generator comprises a first-in first-out (FIFO) unit which provides the actual delay, and an interpolation filter which corrects the values of the samples. The FIFO unit preferably provides the delay to a sample by writing the sample into a memory and reading the sample from the memory after an integral number of cycles of the clock driving the FIFO unit. The period of the clock driving the FIFO unit is referred to herein as a delay step. Preferably, the compensated value for a particular input sample is calculated by interpolation between a number of input samples, so as to correct for the difference between the precise, required delay time and the actual delay time defined in clock cycle steps. Most preferably, the value of the corrected sample is interpolated based on four neighboring samples. Further preferably, the filter handles I and Q samples separately due to their phase difference.

In some preferred embodiments of the present invention, the required delay is a continuous function which changes slowly relative to the delay step. Preferably, a sequence of samples are written into the memory at consecutive addresses and are read from consecutive addresses in the memory. Further preferably, the samples are read from the memory at a constant rate while the samples are written into the memory at a rate which depends on changes in the number of delay steps required from the FIFO unit. Preferably, when a simulation period is started, beginning read and write addresses are assigned to the memory and they are thereafter updated consecutively with each read and write operation, respectively. When the required delay remains substantially constant, read and write operations are performed at the same rate. However, when the required delay increases by an amount greater than the size of the delay step, two write operations are performed in the time a single read is performed. Conversely, when the required delay decreases by an amount greater than the size of the delay step, a cycle without a write operation is performed.

In a preferred embodiment of the present invention, the delay generator is used in order to simulate the transmission of the samples from a base station, via a satellite, to a receiver. Preferably, the delay generator forms part of a multi-channel simulation system as described in a U.S. Patent application Ser. No. 09/531,981 entitled "Satellite Motion Simulator," filed on even date, which is assigned to the assignee of the present patent application and whose disclosure is incorporated herein by reference.

There is therefore provided, in accordance with a preferred embodiment of the present invention, a method for generating a variable delay of a signal, including: providing a clock indicating a sequence of sample times at regular intervals; receiving a sequence of input samples representing input values of the signal at respective sample times indicated by the clock; determining the delay with a temporal resolution substantially finer than the clock interval to be applied to the signal at each of the respective sample times; and for each of the sample times, responsive to the respectively-determined delay, processing one or more of the input samples so as to generate a corresponding output sample representing a delayed output value of the signal at the sample time.

Preferably, the method includes outputting the samples at the regular intervals indicated by the clock.

Preferably, determining the delay includes calculating a delay responsive to a parameter that varies over time, most preferably by calculating a delay that varies from one sample to the next.

Preferably, determining the delay includes determining a delay induced by transmission of the signal through a communications link.

Preferably, determining the delay includes utilizing a process of integration to determine the delay, most preferably utilizing a precalculated differential of the delay based on a model of motion of an object with which the delay is associated.

Preferably, processing the input samples includes dividing the delay into a coarse and a fine component.

Preferably, the coarse component includes the largest number of clock intervals by which the determined delay can be divided, and the fine component includes the remainder of the division. Preferably, processing the input samples includes interpolating between the samples to compute the output sample responsive to the fine component. Most preferably, interpolating between the samples includes assigning respective predetermined coefficients to the one or more input samples, wherein the predetermined coefficients are selected responsive to a magnitude of the fine delay component relative to the clock interval.

Preferably, processing the input samples includes writing the samples to a write address in a memory and reading the samples from a read address therein, wherein the read and write addresses are separated by a difference responsive to a magnitude of the coarse component of the delay.

Preferably, writing the samples includes writing a sample twice in the time of a single read operation when the delay increases. Preferably, writing the samples includes not writing a sample in the time of a read operation when the delay decreases.

There is further provided, in accordance with a preferred embodiment of the present invention, a variable delay generator, which receives as input a sequence of samples of a signal at sample times indicated by a sample clock having a predetermined clock period, and which includes: a delay controller, which determines a variable delay having a temporal resolution substantially finer than the clock interval to be applied to the signal at each of the respective sample times; and a delay line which receives the input sequence of samples and outputs a synchronous stream of output samples at the sample times, each output sample representing a respective value of the signal following the delay determined by the delay controller.

Preferably, the delay controller divides the delay into a coarse and a fine component.

Preferably, the delay line includes an interpolation filter which interpolates among the input samples to generate a value of the output sample dependent on the fine component. Most preferably, the interpolation filter selects interpolation coefficients from among a plurality of predetermined coefficients, which are respectively assigned to the sequence of input samples.

Preferably, the delay unit includes a coarse delay unit which delays the output samples by the coarse component. Preferably, the coarse delay unit includes a first-in first-out memory device, wherein the samples are written to a write address therein and wherein the samples are read from a read address therein, wherein the read and write addresses are separated by a difference responsive to the delay.

Preferably, the delay controller iteratively calculates the delay. Most preferably, the delay controller includes an integrator to determine the variable delay for each of the samples based on a precalculated differential of the delay.

BRIEF DESCRIPTION OF THE DRAWINGS

The present invention will be more fully understood from the following detailed description of the preferred embodiments thereof, taken together with the drawings, in which.

DETAILED DESCRIPTION OF PREFERRED EMBODIMENTS

Figure 1:
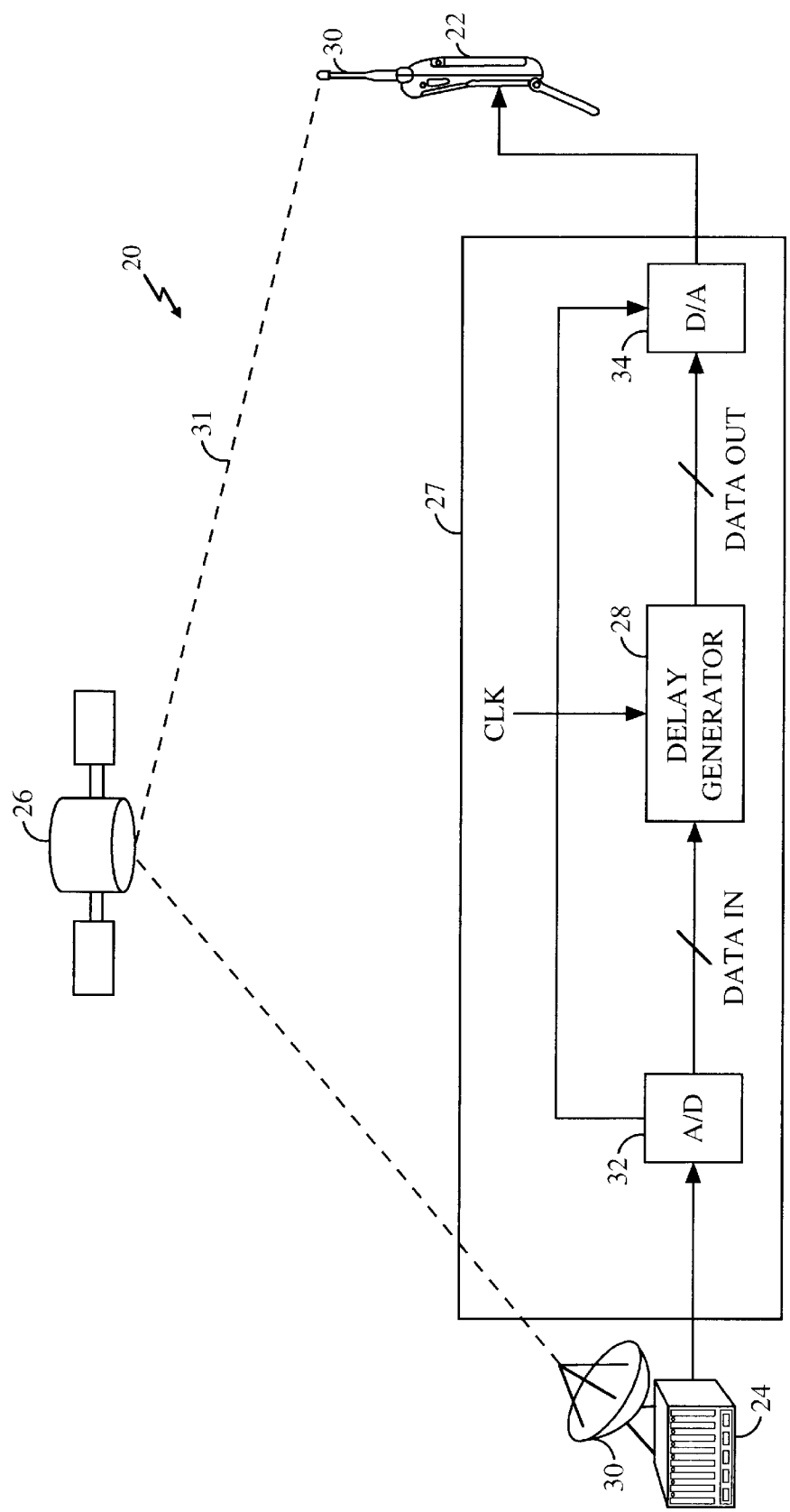
FIG. 1 is a schematic block diagram of a satellite communication system and a corresponding delay generator, in accordance with a preferred embodiment of the present invention.

FIG. 1 is a schematic block diagram of a satellite communication system 20 and a corresponding simulation system 27, in accordance with a preferred embodiment of the present invention. A handset 22 communicates with a base station 24 via a satellite 26 which, for example, belongs to a low-earth orbit (LEO) satellite array, such as the Globalstar system.

In order to test the operation of base station 24 and handset 22 without going through satellite 26, simulation system 27 is connected between RF ports 30 of base station 24 and handset 22. System 27 processes the signals passing between base station 24 and handset 22 as if the signals were passing along a path 31 via satellite 26, wherein the signals undergo varying delays. System 27 preferably comprises a delay generator 28 which delays the signals from base station 24 according to the calculated position of satellite 26.

Other elements, such as a noise generator and a Doppler shift generator (not shown) are preferably also included in system 27. These elements may be implemented entirely separately from delay generator 28, or partly combined with the delay generator.

Preferably, system 27 further comprises an A/D converter 32 which samples and digitizes the RF signals from base station 24. The delayed sampled signals are preferably converted back to analog form by a D/A converter 34. Preferably, generator 28 and converters 32 and 34, as well as the other elements of system 27, operate at the same clock rate using synchronous clock signals so as to simplify the operation of the system. In the following description, differing clock rates are referred to as being based on a basic "chip" rate and multiples thereof. For example, a chip×4 rate corresponds to a rate four times faster than the basic chip rate. In system 27, a single period of the chip rate clock is preferably of the order of 800 ns. The delay imposed by delay generator 28 is typically on the order of delay times for signals transmitted via satellite 26, i.e., in the range of 9–23 ms. It will be understood, however, that delay generator 28, which is described further hereinbelow, may be used over a wide range of different delay times and in various applications not limited to the simulation application described herein.

Figure 2:
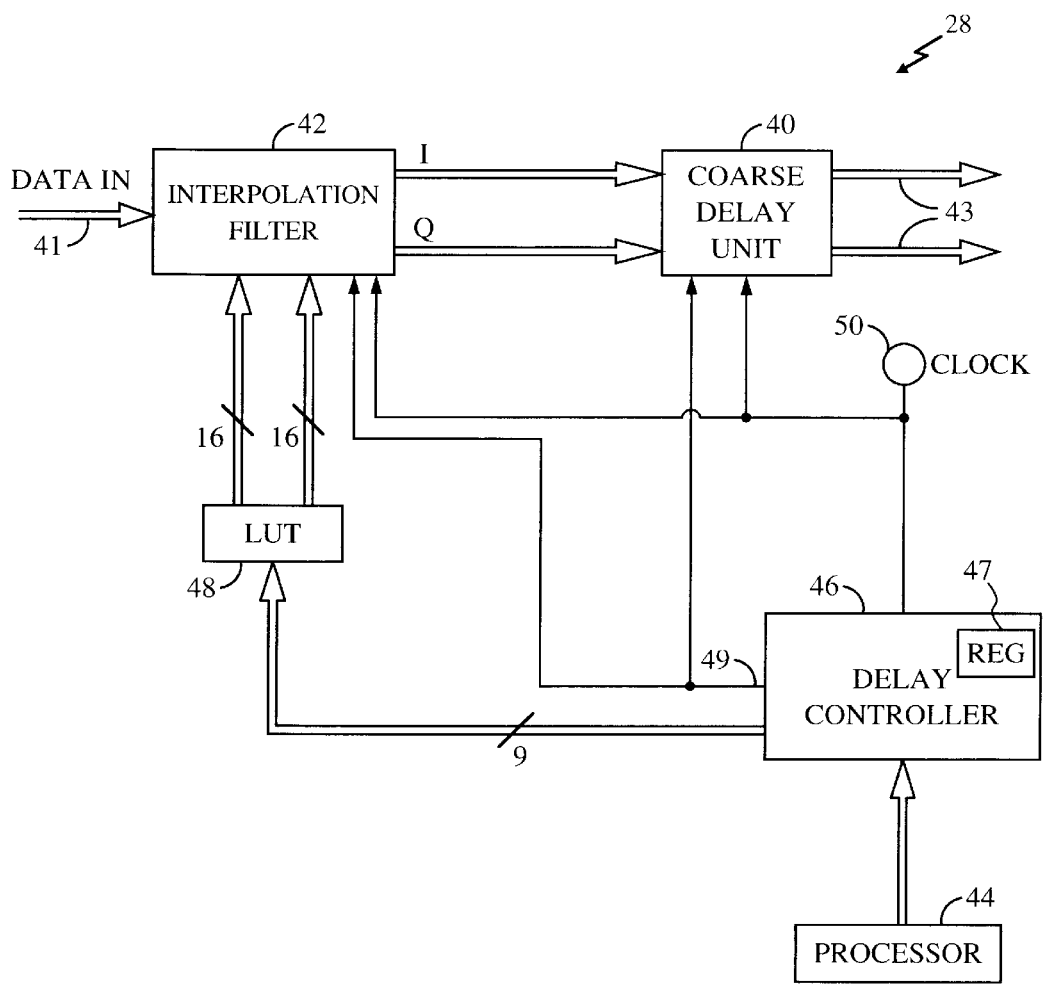
FIG. 2 is a schematic block diagram of a delay generator, in accordance with a preferred embodiment of the present invention.

FIG. 2 is a schematic block diagram of delay generator 28, in accordance with a preferred embodiment of the present invention. Preferably, generator 28 receives an intermediate frequency (IF) signal on a "data in" line 41 at a chip×16 rate, and translates the signal to separate interlaced I and Q digital samples, each at a chip×8 rate, where the terms I and Q are well known as to representing In-Phase and Quadrature Phase signals. The samples are preferably between 8 and 12 bits wide. On two "data out" lines 43, generator 28 provides the delayed I and Q samples, at a rate of chip×4. That is, delay generator 28 decimates the samples in addition to delaying them. This feature is useful in a particular implementation of simulation system 27, although it is not material to the principles of the present invention.

Generator 28 preferably comprises a coarse delay unit 40, which delays each of the incoming samples for a period which is equal to a respective, integral number of delay steps for each sample. Preferably, the delay step is equal to the period of a chip×4 cycle.

Generator 28 also includes an interpolation filter 42 which separately alters the values of each of the I and Q samples entering delay unit 40 in order to correct for inaccuracies introduced by the coarse delay of unit 40. Interpolation filter 42 and delay unit 40 together form a delay line. Preferably, interpolation filter 42 corrects for the inaccuracies by calculating a value of a virtual sample (I or Q) which is then input to unit 40. The process followed by interpolation filter 42 is explained in more detail hereinbelow with reference to FIG. 4 and FIG. 5. Although the following description and the drawings show filter 42 at the input to delay unit 40, those skilled in the art will be able to perform any necessary changes in order to position filter 42 at the output of unit 40.

Preferably, generator 28 further comprises a processor 44 which calculates a theoretical delay for each sample transmitted from base station 24 to handset 22 due to path 31. Preferably, an array of values of the theoretical delay of the samples is calculated at the beginning of a simulation session and stored for use during the simulation, either by processor 44 or by an external processor, which downloads the results to processor 44. The stored values, and first differentials of the stored values, are then used for simulation initiation and at later points in the simulation, as described hereinbelow.

Generator 28 also comprises a delay controller 46 which iteratively calculates, during the simulation session, an actual delay to be applied to each sample. During the simulation session, controller 46 operates as an integrator, which uses a first time differential of the actual delay, in order to calculate a new actual delay.

Figure 3:
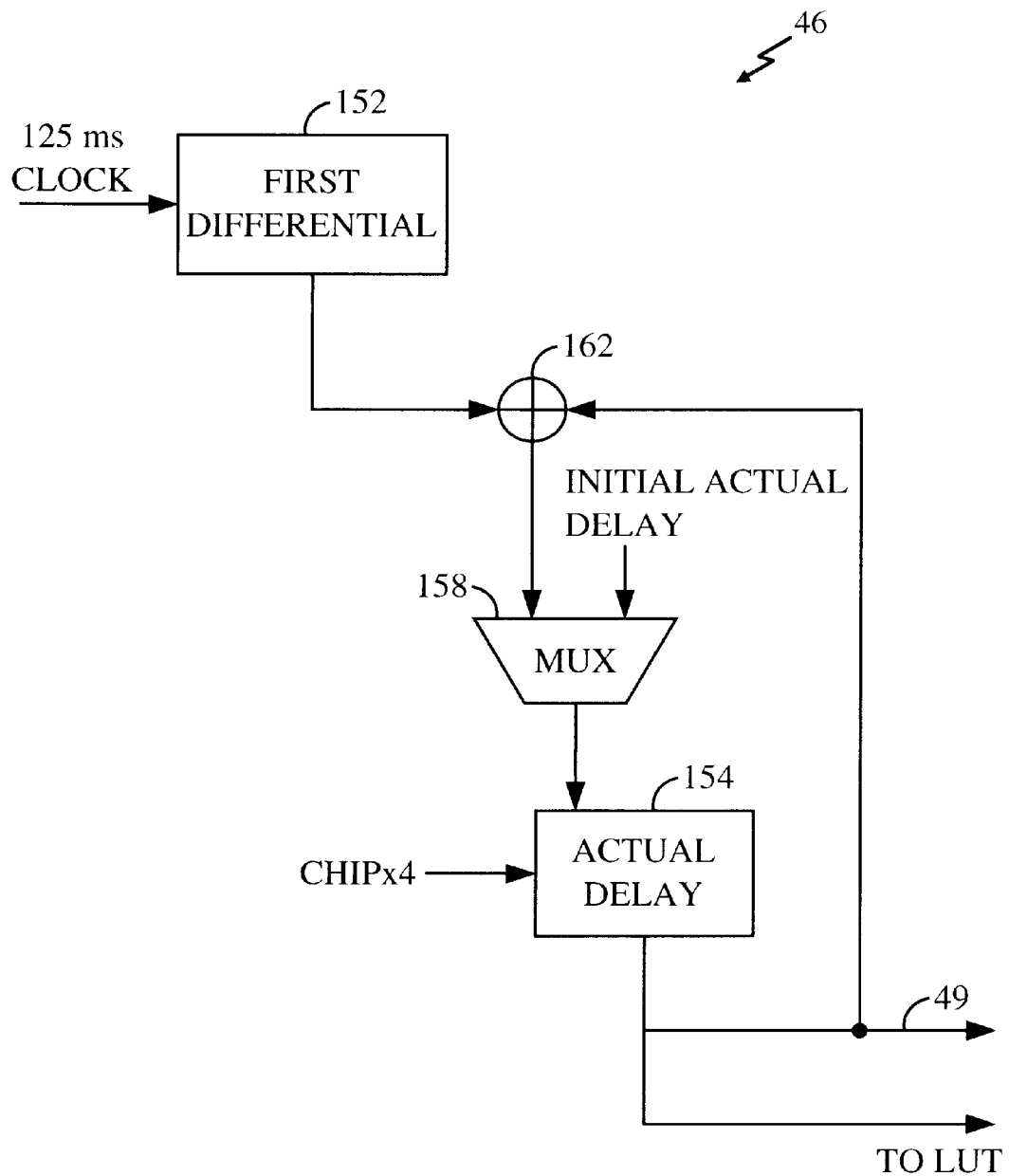
FIG. 3 is a schematic block diagram of a delay controller, in accordance with a preferred embodiment of the present invention.

FIG. 3 is a schematic block diagram of delay controller 46, in accordance with a preferred embodiment of the present invention. Preferably, before the start of the simulation session, processor 44 stores an initial actual delay and an initial first differential of the actual delay, i.e., an initial delay change rate, in an actual delay register 154 and a first differential register 152 respectively. The initial actual delay is entered into actual delay register 154 via a multiplexer 158.

During the simulation session an adder 162 iteratively integrates the actual delay at a chip×4 rate, using the first differential stored in register 152, and stores the result in register 154. Preferably, the value of the first differential stored in register 152 is updated at a rate of once every 125 ms, from values calculated by processor 44. Register 154 thus contains a continuously updated value of the actual delay.

Returning to FIG. 2, for each sample the actual delay calculated as described above by controller 46 is divided into two parts: a coarse delay comprising an integral number of delay steps imposed by unit 40, and a fine delay, which is compensated for by filter 42. The coarse delay is preferably calculated by dividing the actual delay by the delay step of unit 40 (the period of the chip×4 signal), and setting the quotient of the division to be equal to the number of delay steps. The remainder of the division is the fine delay value. The fine delay value is evaluated as an integral number of parts, preferably 512 parts, of a delay step, wherein the integral number is any integer from 0 to 511.

Preferably, at the beginning of the simulation session, processor 44 sets a starting read address and a starting write address which are separated by the coarse delay for an initial sample. The starting read and write addresses are passed to delay unit 40. The fine delay value of the initial sample is stored in a fine delay register 47.

The fine delay value is used by filter 42 in altering the respective values of the data-in samples, as described hereinbelow. Delay controller 46 also generates control signals on a line 49 when the fine delay value reaches its maximum (corresponding to one complete delay step) or minimum value (zero delay steps). At this point, delay controller 46 generates a signal that changes the length of the coarse delay introduced by unit 40.

Preferably, fine delay register 47 accepts a fixed range of integer values, for example, values between 0–511. When the fine delay value exceeds 511, it is reset to zero (i.e., reduced by the maximum value), and an overflow signal is output from control 46 to line 49. Likewise, when the fine delay value goes below 0, 511 is added to the value in register 46, and an underflow signal is provided. The underflow and overflow signals are provided both to delay unit 40 and to filter 42. Unit 40 uses the underflow signal to decrease the coarse delay by one complete delay step, and uses the overflow signal to increase the coarse delay by one complete delay step. In the overflow case, filter 42 generates an additional sample to be written into a coarse delay unit memory comprised in unit 40. The additional sample is written during an additional write operation performed during a single coarse delay unit cycle that is needed to increase the delay by one delay step, as described in more detail below. In the underflow case, filter 42 skips the next sample writing cycle, so as to decrease the delay by one delay step.

The fine delay value in register 47 is used as an index to a double look up table (LUT) 48 which provides interpolation coefficients to filter 42 for I and Q samples separately. LUT 48 is preferably implemented by two 2K×16 bits PROM memories, although any other suitable memory unit may be used.

A clock 50 provides clock signals to unit 40 and filter 42 at a rate of chip×16. Thus, samples are input on line 41 every clock period of clock 50, and an I and a Q sample are output from simulator 28 on lines 43 every four clock periods.

Figure 4:
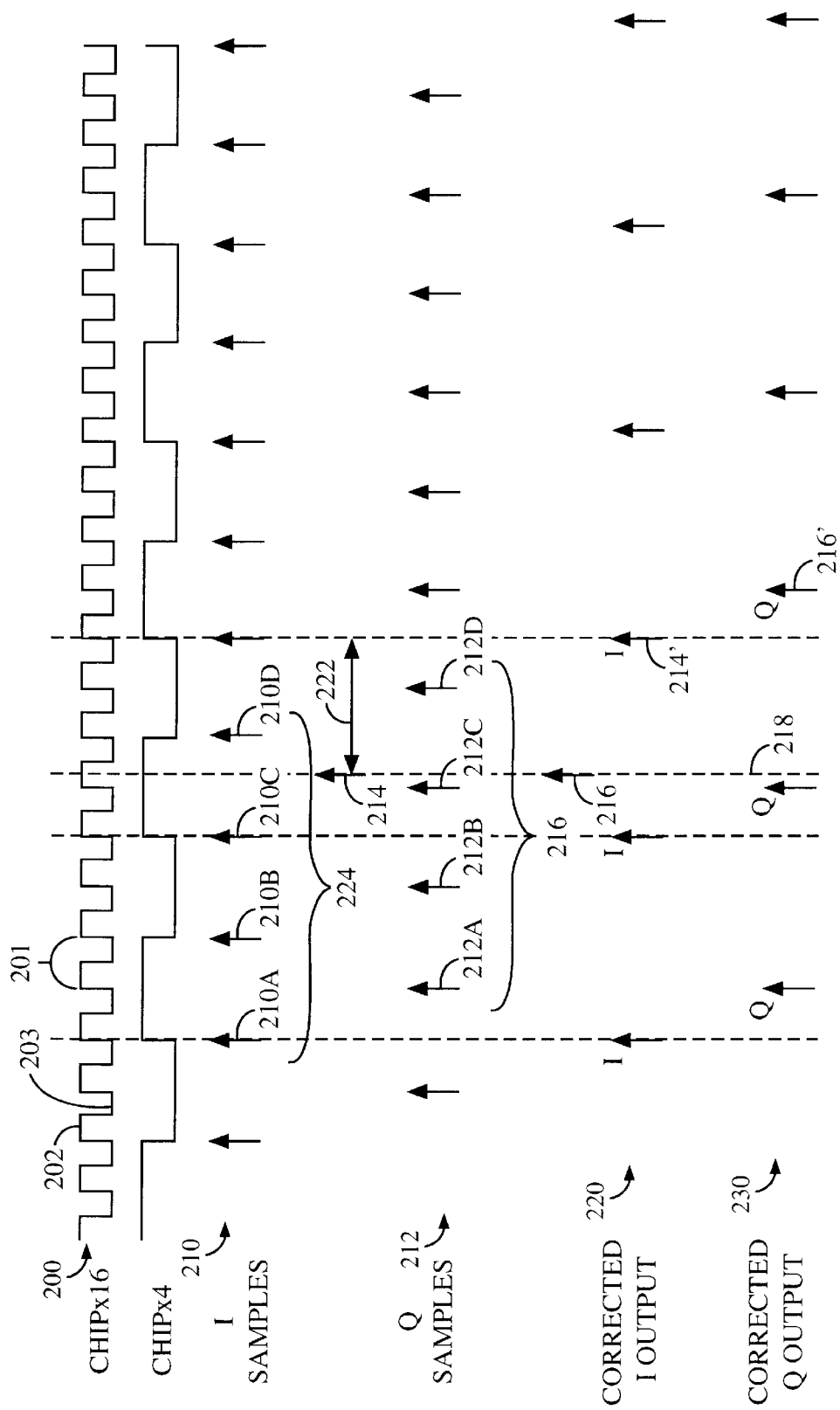
FIG. 4 is a timing diagram that schematically illustrates operation of an interpolation filter, in accordance with a preferred embodiment of the present invention.

FIG. 4 is a schematic timing diagram showing signals associated with interpolation filter 42, in accordance with a preferred embodiment of the present invention. A chip×16 signal 200 illustrates the chip×16 clock signal regulating the operation of delay simulator 28. Signal 200 is formed of a sequence of chip×16 periods 201, formed of a high period 202 and a low period 203.

Interpolation filter 42 alternately extracts uncorrected input I samples 210 and uncorrected input Q samples 212 from line 41 at fixed times at a total rate of chip×16. For example, the I samples may be extracted at odd chip×16 periods, and the Q samples may be extracted at even chip×16 periods. Filter 42 provides delay unit 40 with corrected I samples 220 and corrected Q samples 230. To correct the value of incoming samples, filter 42 generates a corrected I sample 214, and outputs it as a sample 214' at a next available chip×4 time, with a value as if it were sampled from the source signal of base station 24 at time 218. The time 218 is determined such that the period 222 between time 218 and the closest output sample 220 is equal to the fine delay value held by delay register 47.

Time 218 may be located anywhere between two adjacent output samples 220. Typically, time 218 will shift gradually relative to the times of samples 220, due to gradual change in the total delay time. When the required delay slowly increases, time 218 moves to the left. When time 218 substantially coincides with the sample 220 on its left, the delay provided by filter 42 is maximal and an overflow signal is generated. Conversely, when time 218 coincides with the sample 220 on its right, the delay provided by filter 42 is minimal, and an underflow signal is generated.

Sample 214 is preferably interpolated from a set 224 of four input I samples 210A, 210B, 210C, and 210D, using a suitable interpolation method, preferably finite impulse response (FIR) filtering, wherein each of the input I samples is multiplied by a respective coefficient and the products are summed. A set of suitable coefficients for each fine delay value from 0 to 511 is stored in LUT 48 and used in the calculation, as described further hereinbelow. Alternatively or additionally, any other number of samples 210 may be used in interpolation.

Similarly, corrected Q sample 216, output as a sample 216' at a next available chip×4 time, is prepared by interpolation of a set 226 of four Q samples 212A, 212B, 212C, and 212D. The interpolation is performed separately because of the time difference between the I and Q input samples.

Figure 5:
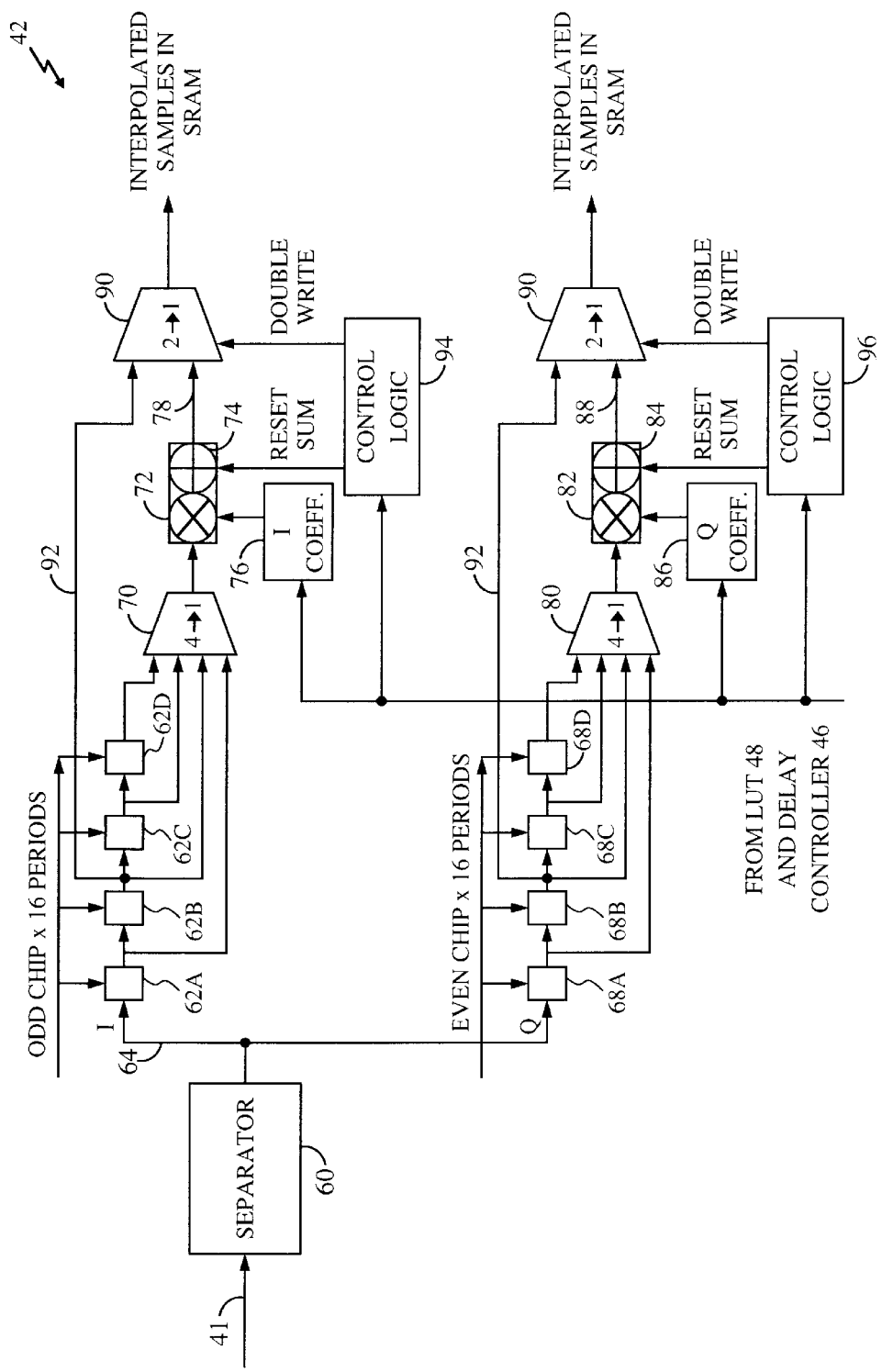
FIG. 5 is a schematic block diagram of the interpolation filter referred to in FIG. 4, in accordance with a preferred embodiment of the present invention.

FIG. 5 is a schematic block diagram of interpolation filter 42, in accordance with a preferred embodiment of the present invention. Filter 42 comprises a separator 60 which receives samples from line 41 and separates the incoming samples to I and Q samples, as is known in the art. Separator 60 receives input samples at a rate of chip×16 and provides interlaced I and Q samples, each at a rate of chip×8, to respective lines 64 and 66.

The I samples are passed on line 64 on odd chip×16 periods and are held in four registers 62A, 62B, 62C and 62D (referred to also as registers 62) which store the four most recent samples, corresponding to 210A, 210B, 210C, and 210D referred to in FIG. 4. Each sample first enters register 62A and upon the next odd chip×16 period passes to register 62B. At the next two odd chip×16 periods the sample is passed to registers 62C and 62D and thereafter it is discarded. Similarly, the Q samples are passed on line 66 to four registers 68A, 68B, 68C and 68D (referred to also as registers 68), on even chip×16 periods.

Preferably, during four chip×16 periods (at a rate of chip×4), filter 42 calculates an interpolated I output sample based on the four input samples in registers 62. During any specific chip×4 period, the four input samples comprise two new samples in registers 62A and 62B, and two samples which had been in registers 62A and 62B during the previous chip×4 period, and which have been transferred to registers 62C and 62D. The four input samples thus comprise two new samples, and two "old" samples. At each chip×16 period, a multiplexer 70 passes one of the samples in registers 62 into a multiplier 72 which multiplies each of the samples from registers 62 by a respective coefficient from a register 76, providing a weighted sample. The coefficient in register 76 is preferably received from LUT 48 according to the value of the fine delay in register 47 and according to which of the four samples is being multiplied.

An adder 74 sums up the four weighted samples to form the interpolated I output sample on a line 78. Preferably, multiplier 72 and adder 74 comprise a single multiplier-accumulator chip, as is known in the art. In a similar manner to that of the I samples, filter 42 calculates an interpolated Q output sample provided on a line 88, based on the four input samples in registers 68. Preferably, the interpolation is performed in a similar manner to that described above, using a multiplexer 80, a multiplier 82, an adder 84 and a Q-coefficient register 86. Control logic blocks 94 and 96 are used to clear adders 74 and 84 respectively, at a chip×4 rate, after each set of four input samples has been utilized to generate an interpolated value.

LUT 48 contains different sets of values for coefficient registers 76 and 86, due to the phase difference (one chip×16 period) between the I and Q samples. Preferably, each set of values includes four coefficients for each of the values of fine delay register 47. Thus, if register 47 may receive 512 values, LUT 48 stores 2×4×512 coefficients. Values of the coefficients are preferably chosen so that they weight the four samples to which they are applied so as to form a linear average, although any other sets of coefficients may be used, as is known in the art.

Figure 6:
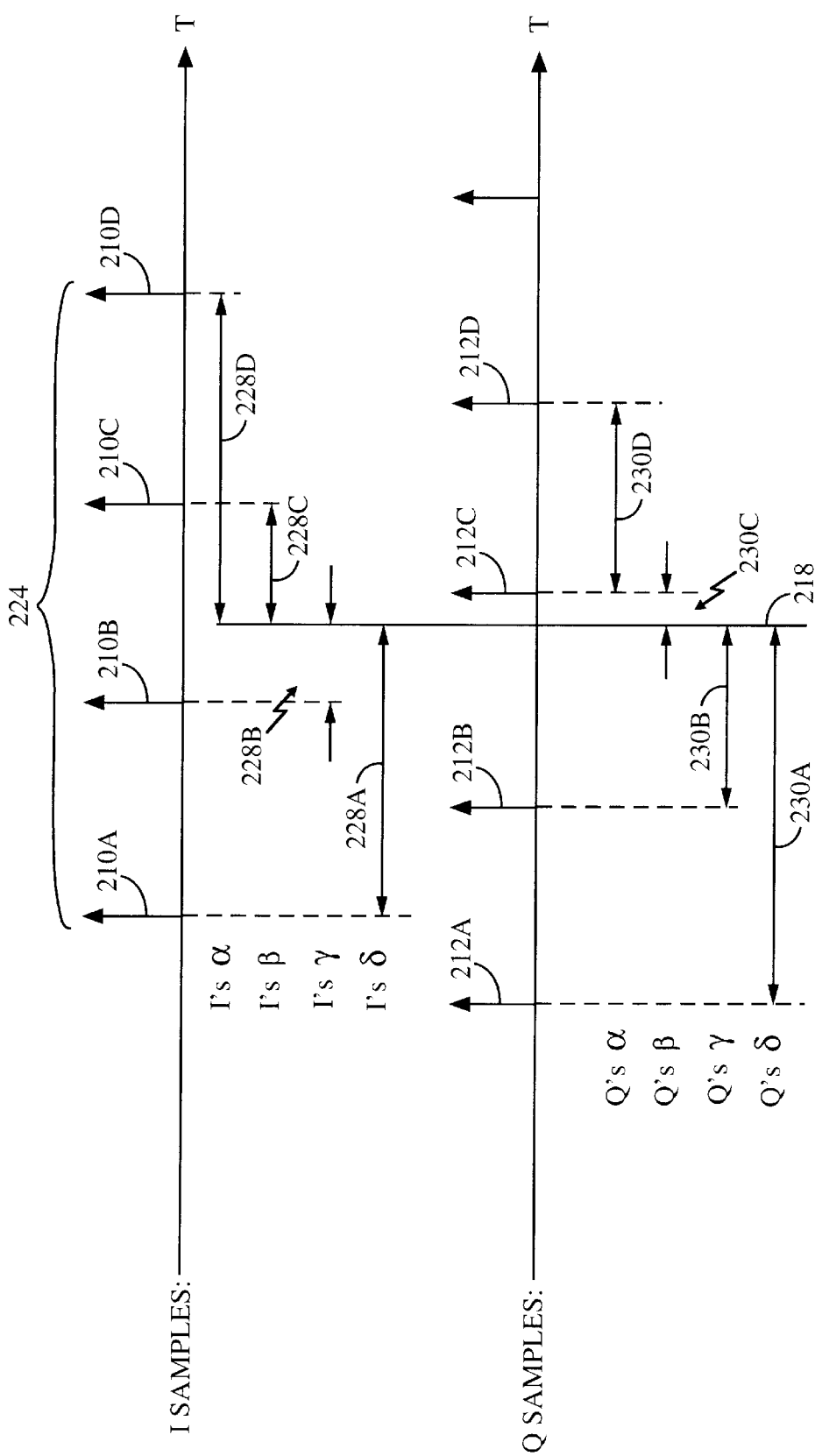
FIG. 6 is a timing diagram that schematically illustrates calculation of values in a coefficient look up table, in accordance with a preferred embodiment of the present invention.

FIG. 6 is a schematic timing diagram illustrating how LUT 48 is used, in accordance with a preferred embodiment of the present invention. As described with reference to FIG. 4, filter 42 calculates the value of a virtual I sample taken at time 218, based on samples 210A, 210B, 210C, and 210D, of set 224. Preferably, each of the samples in set 224 is multiplied by a respective coefficient $\alpha$, $\beta$, $\gamma$ or $\delta$, which coefficients are based respectively on time intervals 228A, 228B, 228C, and 228D between time 218 and the respective sample of set 224. The value I' of the virtual sample is given by:

$$I' = I_A \alpha_n + I_B \beta_n + I_C \gamma_n + I_D \delta_n, 0 < n \leq 511,$$

where $I_A$, $I_B$, $I_C$, and $I_D$ are respective values of samples 210A, 210B, 210C, and 210D.

A similar process is used by filter 42 to calculate the value of an imaginary Q sample, based on samples 212A, 212B, 212C, and 212D, of set 226, and respective coefficients 230A, 230B, 230C, and 230D. Alternatively, the coefficients are chosen according to any other suitable interpolation method.

Referring back to FIG. 4 and FIG. 5, in normal operation, filter 42 provides I and Q interpolated samples every chipx4 period. The provided interpolated samples are preferably output through multiplexers 90. However, when delay controller 46 generates an underflow control signal which indicates that the delay incurred by unit 40 must be decreased, filter 42 provides a sample as usual, but no write signal is generated for that chipx4 period.

Conversely, when delay controller 46 generates an overflow control signal which indicates that the delay incurred by unit 40 must be increased, filter 42 provides two samples: an interpolated sample, as in every other cycle, and one of the samples stored in filter 42 (registers 62 for I samples and registers 68 for Q). Two write signals are then generated during a single chipx4 period. Control logic blocks 94 and 96 receive signals from delay controller 46 indicating when two samples are to be provided, and pass an appropriate signal to multiplexers 90. The first interpolated sample is provided as in every normal chipx4 period, preferably during the first chipx16 period of the chipx4 period. The second sample is provided thereafter, preferably during the second chipx16 period of the chipx4 period. The second sample is provided along lines 92 and selected by multiplexers 90. Lines 92 provide the contents of registers 62 and 68, respectively, which contain the values of samples 210 and 212, respectively.

Figure 7:
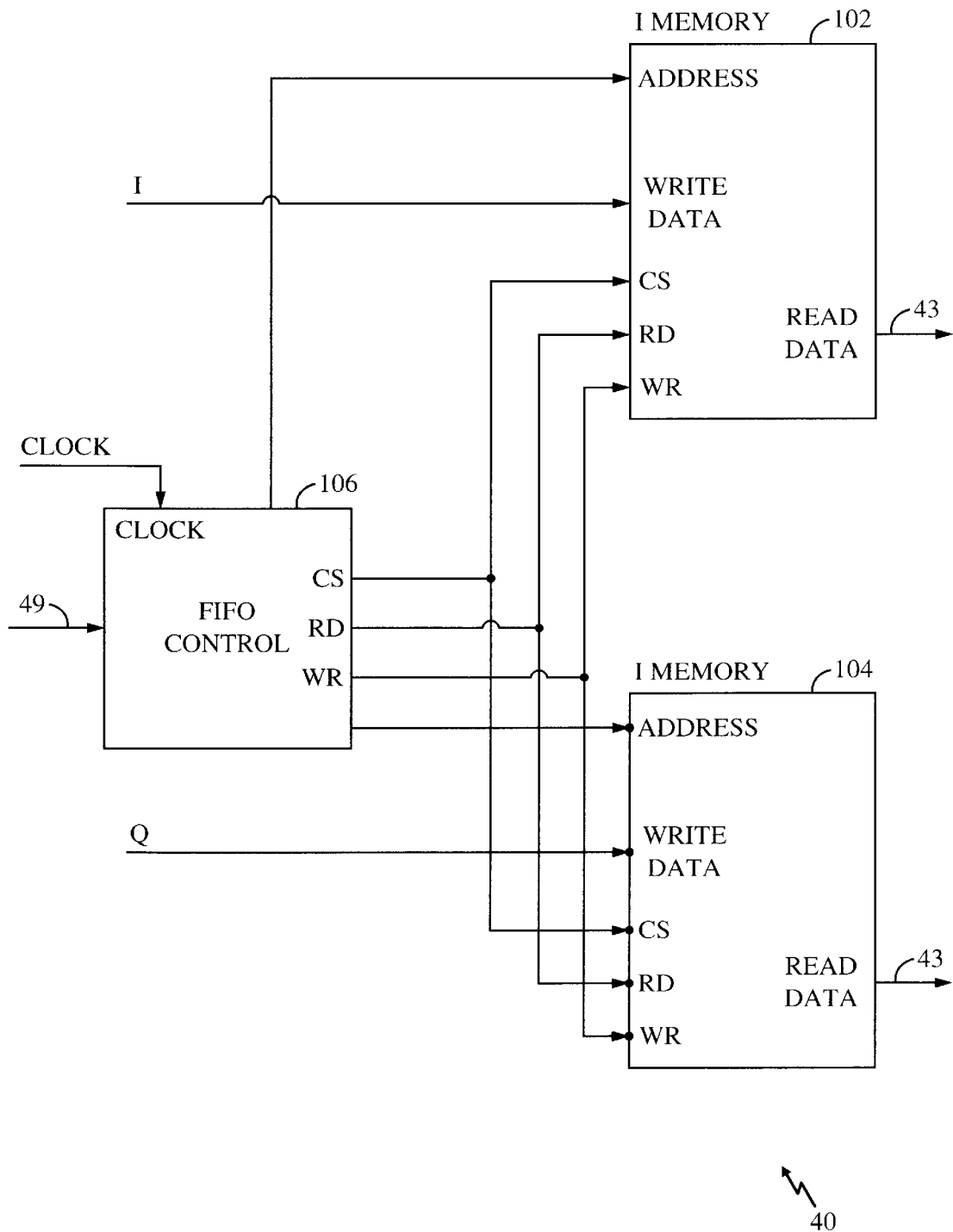
FIG. 7 is a schematic block diagram of a delay unit, in accordance with a preferred embodiment of the present invention.

FIG. 7 is a schematic block diagram of delay unit 40, in accordance with a preferred embodiment of the present invention. Delay unit 40 comprises two memory units 102 and 104 which delay the I and Q samples, respectively. Memory units 102 and 104 preferably comprise standard SRAM chips. Most preferably, each of the units comprises two 128Kx8 bit chips. Memory units 102 and 104 receive the samples from filter 42 and output the samples on lines 43. The operation of memory units 102 and 104 is controlled by a controller 106, which operates the SRAM as a first-in first-out (FIFO) memory by managing the read and write addresses of memory units 102 and 104 and their control signals, e.g., chip select CS, read enable RD and write enable WR.

Figure 8:
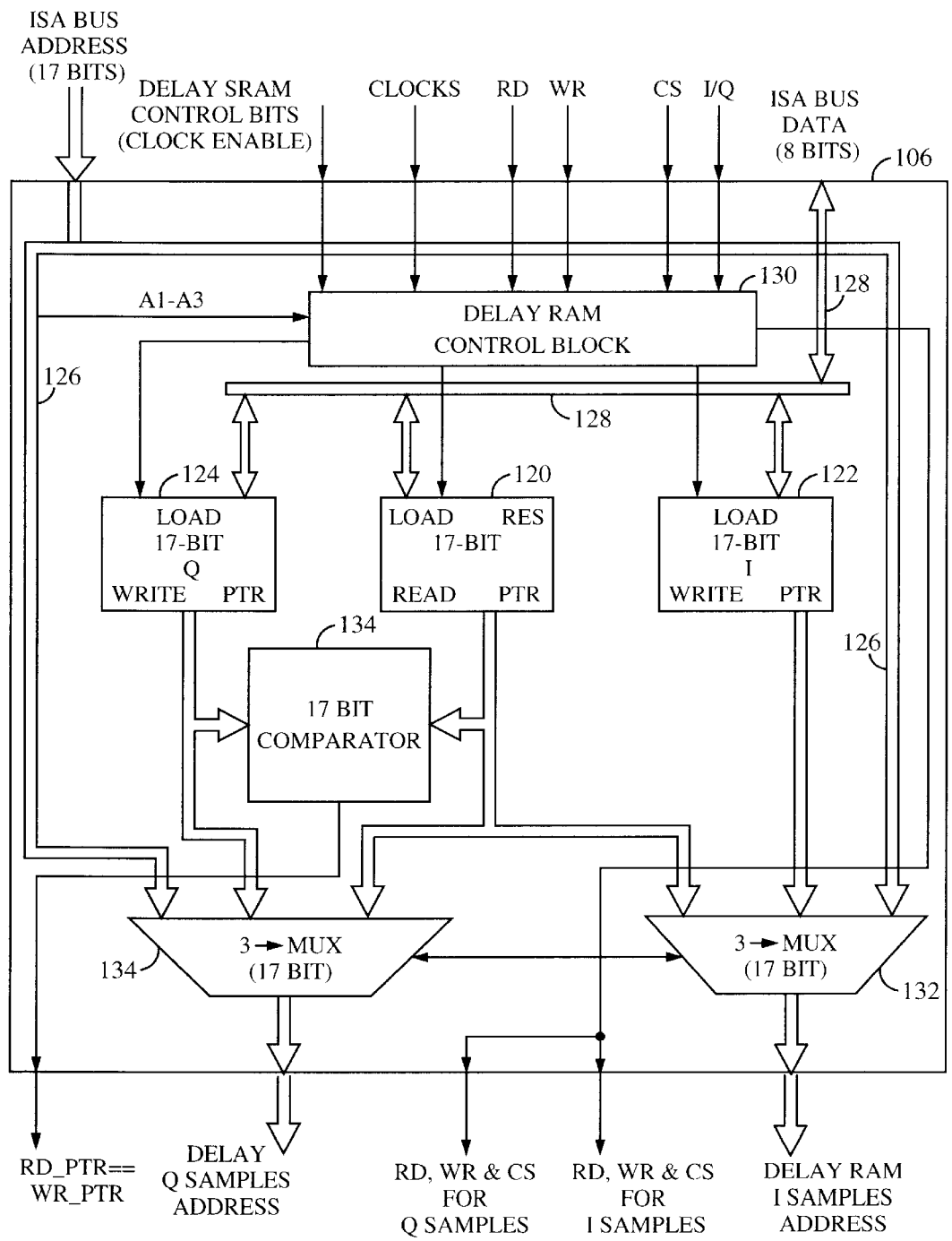
FIG. 8 is a schematic block diagram of a FIFO control circuit in the delay unit of FIG. 7, in accordance with a preferred embodiment of the present invention.

FIG. 8 is a schematic block diagram of controller 106, in accordance with a preferred embodiment of the present invention. Controller 106 comprises a counter 120 which stores a common read address for both of memory units 102 and 104, and two additional counters 122 and 124 which store the write addresses of memory units 102 and 104, respectively. Preferably, controller 106 includes an ISA or other suitable address bus 126 and an ISA or other suitable data bus 128 used for loading initial data at the beginning of the simulation session and for debugging. Two multiplexers 132 and 134 determine the source of the address passed to memory units 102 and 104, respectively. A control block 130 receives the control signals from line 49 and a clock signal from clock 50, and accordingly generates appropriate control signals output to memory units 102 and 104, as well as to counters 120, 122 and 124 and multiplexers 132 and 134. A 17 bit comparator 136 signals if the read and Q write values in counters 120 and 124 are the same, and is used as an error warning generator.

Figure 9:
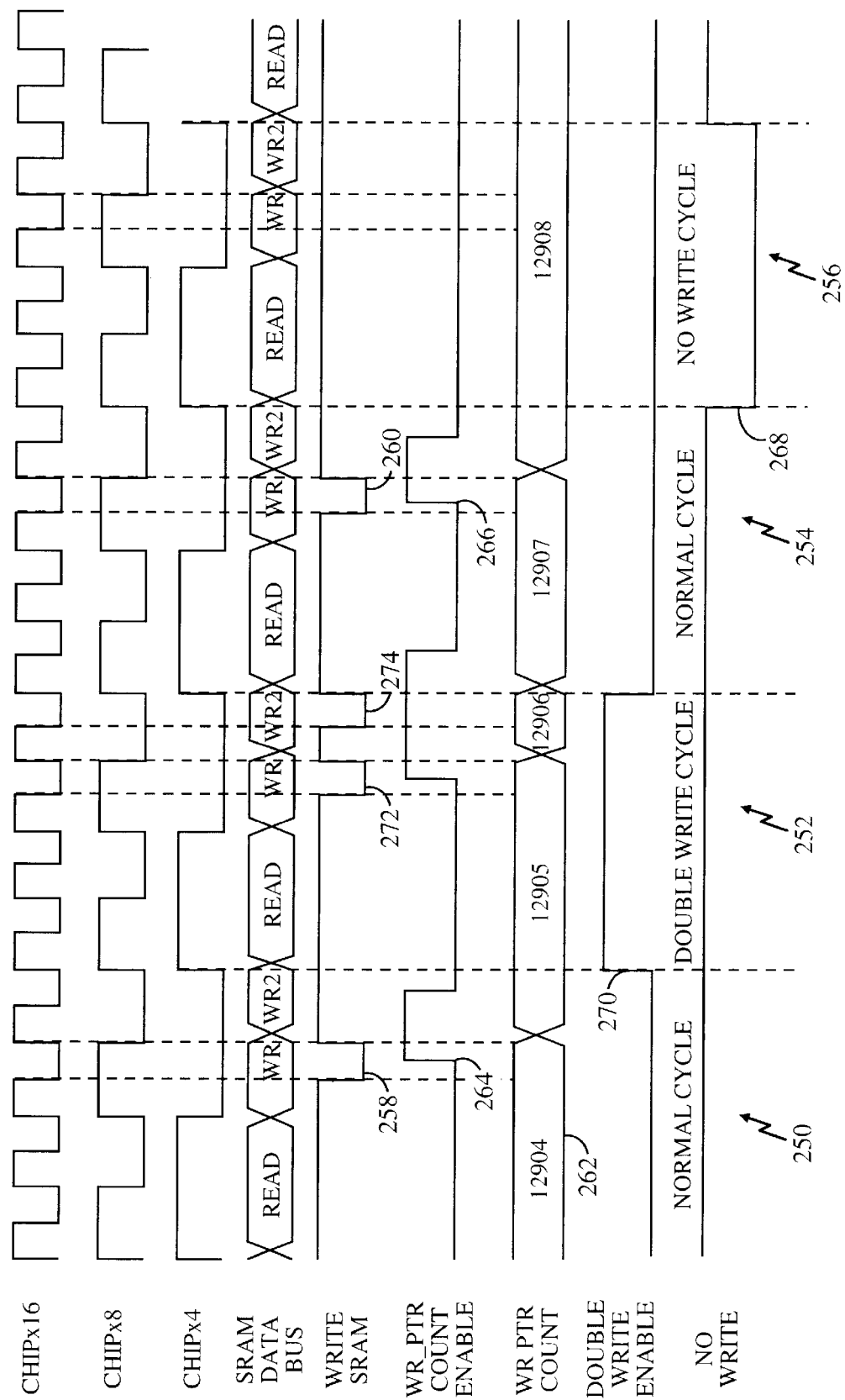
FIG. 9 is a schematic timing diagram of the delay unit of FIG. 7, in accordance with a preferred embodiment of the present invention.

FIG. 9 is a schematic timing diagram relating to coarse delay unit 40, in accordance with a preferred embodiment of the present invention. During the simulation session, memory units 102 and 104 provide a delayed sample every chipx4 period, and a read pointer is incremented accordingly. Normally, as shown for chipx4 periods 250 and 254, during each chipx4 period, each of memory units 102 and 104 also receives a single interpolated sample from filter 42, i.e., a sample is written to each of the memory units during a chipx16 period marked WR, when a write SRAM signal is set at respective times 258 and 260. During these periods, a write pointer counter 262 of each memory unit increments once in a chipx4 period, when a write pointer counter enable signal is set at respective times, for example, at times 264 and 266. (The numbers 12904, 12905, etc., represent dummy values of the write pointer.)

However, as shown for a no-write chipx4 period 256, in chipx4 periods in which an underflow control signal is received on line 49 (FIG. 2), a no-write signal is set at time 268, and no sample is written into the memory unit (either 102 or 104) for which the underflow signal is received. During the underflow chipx4 period, memory units 102 and 104 provide output samples as usual and increment the read pointer, and, thus, the delay provided by the underflowed memory unit is increased, since the write pointer is not incremented.

In a chipx4 period 252, when an overflow signal is received on line 49, a double write enable signal is set at time 270. As a result, two samples are written into the memory unit for which the overflow signal is received when the write SRAM signal is set at respective times 272 and 274. In this case, the delay provided by the overflowed memory unit is shortened, since write pointer counter 262 is incremented twice in a chipx4 period.

Although the above-described preferred embodiments relate generally to a satellite communications simulator, those skilled in the art will appreciate that the principles of the present invention may be applied to produce variable delay generators for use in other applications, as well. It will thus be understood that the preferred embodiments described above are cited by way of example, and the full scope of the invention is limited only by the claims.

What we claim as our invention is:

1. A method for generating a variable delay of an input signal, comprising:

providing a clock signal having a pre-selected period;

sampling said input signal using said clock signal to form a plurality of input signal samples;

calculating a delay time in response to a parameter that varies over time, which is less than said pre-selected period of said clock signal; and processing at least one of said input samples so as to generate a corresponding delayed output sample which represents a delayed output value of the input signal at the sample time.

2. The method of claim 1 wherein calculating a delay time comprises calculating a delay as induced by transmission of the signal through a communications link with, which is less than said pre-selected period of said clock signal.

3. The method of claim 1 wherein calculating a delay time comprises calculating a delay time utilizing a process of integration, which is less than said preselected period of said clock signal.

4. A method according to claim 3, wherein utilizing the process of integration comprises utilizing a precalculated differential of the delay based on a model of motion of an object with which the delay is associated.

5. A method for generating a variable delay of an input signal, comprising:

providing a clock signal having a pre-selected period;

calculating a delay time which is less than said pre-selected period of said clock signal;

processing at least one of said input signal samples, so as to generate a corresponding delayed output sample which represents a delayed output value of the input signal at the sample time, the processing of the input samples including dividing the delay into a coarse and a fine component.

6. A method according to claim 5, wherein the coarse component comprises the largest number of clock signal periods by which the determined delay can be divided.

7. A method according to claim 6, wherein the fine component comprises the remainder of the division.

8. A method according to claim 5, wherein processing the input samples comprises writing the samples to a write address in a memory and reading the samples from a read address therein, wherein the read and write addresses are separated by a difference responsive to the coarse component of the delay.

9. A method according to claim 8, wherein writing the samples comprises writing a sample twice in the time of a single read operation when the delay increases.

10. A method according to claim 8, wherein writing the samples comprises not writing a sample in the time of a read operation when the delay decreases.

11. A variable delay generator, which receives an input a signal, comprising:

a clock signal generator for generating a clock signal having a pre-selected period;

a delay controller, configured to calculate a delay time which is less than said pre-selected period of said clock signal, and which divides said variable delay-into a coarse and a fine component; and a delay line which receives at least one of the input signal samples and outputs a synchronous stream of output samples from said input samples at a respective delay determined by the delay controller.

12. A generator according to claim 11, wherein the delay unit comprises a coarse delay unit which delays the output samples by the coarse component.

13. A generator according to claim 12, wherein the coarse delay unit comprises a first-in first-out memory device, wherein the samples are written to a write address therein and wherein the samples are read from a read address therein, wherein the read and write addresses are separated by a difference responsive to a magnitude of the coarse component of the delay.

14. A generator according to claim 11, wherein the delay controller iteratively calculates the delay.

15. A generator according to claim 14, wherein the delay controller comprises an integrator to determine the variable delay for each of the samples based on a precalculated differential of the delay.

16. A variable delay generator, which receives an input a signal over a predetermined period and provides delayed samples whose output is synchronized with input samples, comprising:

a clock signal generator generating clock a signal having a pre-selected period;

means for calculating a delay time, which is less than said pre-selected period of said clock signal; and a generator for compensating for a difference between an actual delay time and the required delay time, which difference is evaluated over a time interval substantially finer than said pre-selected period of said clock.

* * * * *